United States Patent
McPherson

(10) Patent No.: US 9,967,977 B1
(45) Date of Patent: May 8, 2018

(54) STEP ETCHED METAL ELECTRICAL CONTACTS

(71) Applicant: Arkansas Power Electronics International, Inc., Fayetteville, AR (US)

(72) Inventor: Brice McPherson, Fayetteville, AR (US)

(73) Assignee: Cree Fayetteville, Inc., Fayetteville, AR (US)

( * ) Notice: Subject to any disclaimer, the term of this patent is extended or adjusted under 35 U.S.C. 154(b) by 713 days.

(21) Appl. No.: 14/308,283

(22) Filed: Jun. 18, 2014

Related U.S. Application Data

(60) Provisional application No. 61/836,477, filed on Jun. 18, 2013.

(51) Int. Cl.
*H05K 1/11* (2006.01)

(52) U.S. Cl.
CPC ...... *H05K 1/111* (2013.01); *H05K 2201/1081* (2013.01); *H05K 2201/10803* (2013.01)

(58) Field of Classification Search
CPC .......... H05K 1/111; H05K 1/11; H05K 1/112; H05K 1/115; H05K 2201/10803; H05K 2201/1081
USPC ........................................ 174/557, 549, 520
See application file for complete search history.

(56) References Cited

U.S. PATENT DOCUMENTS

2013/0249077 A1\* 9/2013 Do .......................... H01L 23/28
257/737

OTHER PUBLICATIONS

L. Larson, D. Jessie, "Advances in RF Packaging Technologies for Next-Generation Wireless Communications Applications", Custom Integrated Circuits Conference, 2003.
G.H. Sarma, G. Nitin, Ramanan, Manivannan, K. Mehta, A. Bhattacharjee, "Mechanical Fatigue Properties of Heavy Aluminum Wire Bonds for Power Applications", Electronics System-Integration Technology Conference (ESTC) Greenwich, 2009.
A. Hamidi, S. Kaufmann, E. Herr, "Increased Lifetime of Wire Bonding Connections for IGBT Power Modules", Applied Power Electronics Conference and Exposition (APEC), Anaheim, CA, 2001.
R. Thompson, Manufacturing Processes for Design Professionals, New York: Thames and Hudson, 2007, pp. 244-247.
F.W. Grover, Inductance Calculations: Working Formulas and Tables, New York: Dover, 1973.
H.M. Greenhouse, "Design of Planar Rectangular Micro-Electronic Inductors", IEEE Trans. on Parts, Hybrids, and Packaging, vol. 10, No. 2, pp. 101-109, 1974.

\* cited by examiner

*Primary Examiner* — Angel R Estrada
(74) *Attorney, Agent, or Firm* — Baker Hostetler LLP

(57) ABSTRACT

A step etched metal electrical contact including a main body formed from a metal sheet defining a metal tab sized to match a die/device terminal and an electrical clearance aperture, electrical clearance trench, and/or an electrical clearance gaps. A heat sink may be combined with the step etched metal electrical contact to provide double sided module cooling for increased thermal performance of power modules.

20 Claims, 3 Drawing Sheets

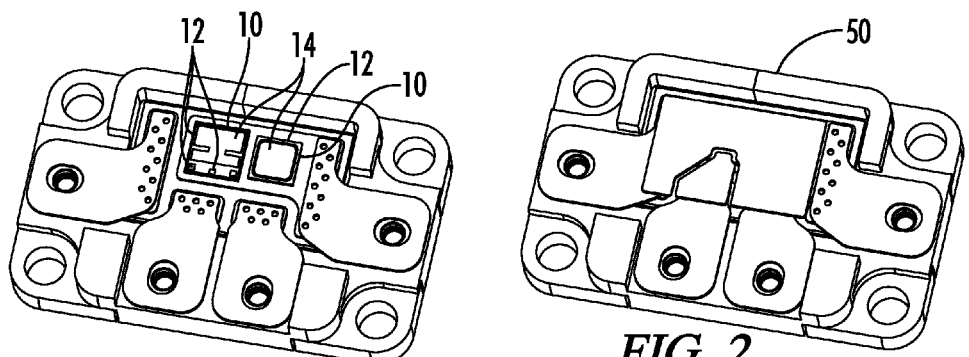
FIG. 1  FIG. 2
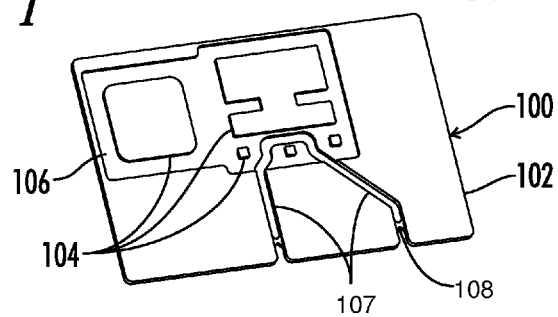
FIG. 3
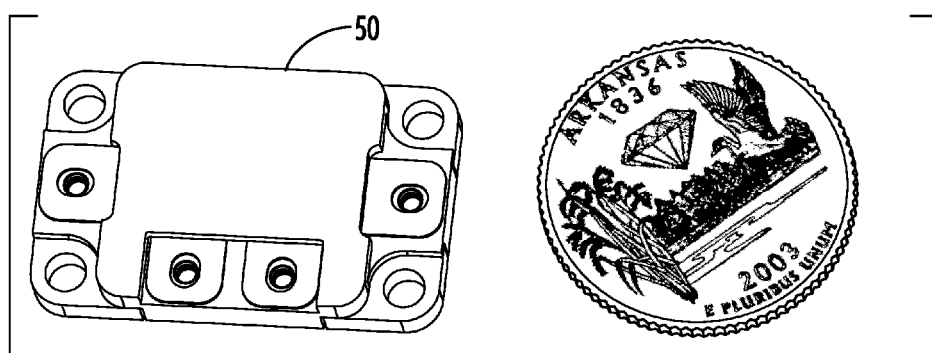
FIG. 4
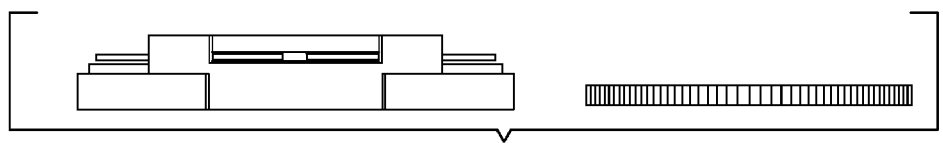
FIG. 5

STEP ETCHED METAL ELECTRICAL CONTACTS

CROSS-REFERENCE TO RELATED APPLICATIONS

This application claims priority to and is a continuation-in-part of U.S. Provisional Patent Application Ser. No. 61/836,477, filed on Jun. 18, 2013 entitled Step Etched Metal Electrical Contacts which is hereby incorporated by reference in its entirety.

STATEMENT REGARDING FEDERALLY SPONSORED RESEARCH OR DEVELOPMENT

Not Applicable.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in step etched metal electrical contacts. More particularly, the invention relates to improvements particularly suited for providing step etched metal electrical contacts for wire bondless high current, high frequency, high temperature power electronic modules.

2. Description of the Known Art

As will be appreciated by those skilled in the art, electrical contacts are known in various forms, but have inherent problems. Parasitic inductances contributed by the packaging and internal interconnection of a power electronic module are a major factor limiting switching speed and performance in a power conversion system. This is even more relevant for high performance wide bandgap power switches, which feature rise and fall times in the 10s of ns and lower. A key challenge to forming an electrical connection to the terminals of a high voltage device is maintaining isolation. The passivation on the top surface of devices is thin and will result in a breakdown if metal touches its surface. Common techniques, including wire and ribbon bonding, are arched into a loop in the forming process, providing the necessary isolation. The loop, however, adds to the distance current must travel to the devices and introduces additional inductance. Additionally, both wire and ribbon have a restrictive geometry both in cross-section and in bond area which limit how much current they may carry. Wire bond interconnects impose enormous challenges for electronic package designers, including:

(1) Considerable parasitic impedances due to small wire cross-sections, such as 0.005 in to 0.020 in, relatively long lengths, and the need for bond loops;
(2) Current crowding on die pads;
(3) Under-utilization of the entire bonding surface;
(4) Possibility of fusing during a current spike;
(5) Stability in high vibration environments;
(6) Clearance issues for the wire bonding equipment;
(7) Potential reliability issues during power cycling;
(8) Metallurgical compatibility concerns; and
(9) Reliability concerns in extreme environments such as high g-force applications As power devices continue to reduce in size, the bondable real-estate for parallel bonds is diminished, further exacerbating these issues. Additional issues arise in the physical layout, as conventional power substrates are limited to single layers of conduction and interconnection. Often, wire bond jumpers are employed to compensate for these layout restrictions, which further increase the inductance. Ultimately, the minimization of interconnection inductance is paramount to increase performance and reduce the size and weight of a power electronic system. These benefits would be encountered in the module itself, allowing higher power density, and at the system level, allowing higher switching frequencies to allow for smaller filter and magnetic component sizes.

There are various alternatives to wire bonds that have been adopted in industry, including flip chip attaches and ribbon bonding. While traditional flip chip technology has drastically increased packaging density in lower voltage integrated circuits, it is a poor fit for high power switches. This is due to an assortment of issues, the most restrictive of which is the detrimental impact of the interrupted heat transfer path from the underfill. The underfill is a material applied underneath the device to provide structural support between the soldered contacts and a coefficient of thermal expansion, CTE, match with the semiconductor. Ribbon bonds are promising and can be effective, but suffer similar problems to wire bonds in that they (1) do not contact the entire die pad, (2) require a loop, which increases the current path length, (3) have limited geometries, most particularly in thickness, and (4) can experience similar metallurgical interactions at high temperatures as wire bonds.

Articles disclosing information relevant to this application include:
[1] L. Larson, D. Jessie, "Advances in RF Packaging Technologies for Next-Generation Wireless Communications Applications", Custom Integrated Circuits Conference, 2003
[2] G. H. Sarma, G. Nitin, Ramanan, Manivannan, K. Mehta, A. Bhattacharjee, "Mechanical Fatigue Properties of Heavy Aluminum Wire Bonds for Power Applications", Electronics System-Integration Technology Conference (ESTC), Greenwich, 2009
[3] A. Hamidi, S. Kaufmann, E. Herr, "Increased Lifetime of Wire Bonding Connections for IGBT Power Modules", Applied Power Electronics Conference and Exposition (APEC), Anaheim, Calif., 2001
[4] R. Thompson, Manufacturing Processes for Design Professionals, New York: Thames and Hudson, 2007, pp. 244-247
[5] F. W. Grover, Inductance Calculations: Working Formulas and Tables, New York: Dover, 1973
[6] H. M. Greenhouse, "Design of Planar Rectangular Micro-Electronic Inductors", IEEE Trans. on Parts, Hybrids, and Packaging, Vol. 10, No. 2, pp. 101-109, 1974.

Each of these articles is hereby expressly incorporated by reference in their entirety.

From these prior references it may be seen that an improved electrical contact is needed to overcome these limitations.

SUMMARY OF THE INVENTION

The present invention is directed to an improved electrical contact using a step etched metal electrical contact. The invention described herein, named PowerStep, introduces a novel solution to these issues by replacing wire bonds entirely with a precision formed, three dimensional metal tab attached directly to the device terminal surface, providing enhanced electrical, thermal, and mechanical capabilities. The distinguishing factor of this approach lies in the geometry of the tab itself. With PowerStep, the isolation distance is partially etched in a planar and self-supporting metal lead frame such as Al, Cu, or low CTE alloy, providing the necessary gap between the device passivation and electrical path. Raised regions matching the size and location of device terminals, such as gate, source, anode, etc., and fully etched trenches for isolation between connections are rapidly and inexpensively formed with conventional etching equipment and processes. The profiled sheet is then attached with a standard soldering operation with reliable high temperature solders such as 80Au/20Sn, often concurrently with the die attach saving processing time and cost. It may also be attached through Thermosonic bonding in the case of aluminum tabs or through a conductive epoxy.

When attached to the terminals of a power device, the tab produces a wide, low profile bond which completely utilizes all of the available terminal area for conduction. The cross-sectional area of the tab can be custom tailored and scaled for each device to minimize inductance and maximize current capacity. It also creates a secondary path for heat removal, which can be employed to enhance the thermal performance of the package and particularly for power transients. PowerStep is compelling when compared to other wire bondless approaches such as flip chip, etc. in that each process utilized here is already performed in the manufacturing process ie: etching, plating, soldering and is uniquely suited for high currents and high heat loads.

The following advantage and highlights are possible through this technique:

Extremely low inductance interconnects;
High conductivity current paths;
Complete utilization of the device terminal area;
Very high current carrying capability without fusing concerns;
Rugged soldered connections;
Low cost manufacturing processes already performed in power module assembly;
Increased design flexibility due to a secondary interconnection plane;
Possibility for double sided cooling of the assembly; and
Compact, ultra-low profile packaging.

These and other objects and advantages of the present invention, along with features of novelty appurtenant thereto, will appear or become apparent by reviewing the following detailed description of the invention.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views:

FIG. 1 is a top perspective view of a power module with a step etched metal contact installed.

FIG. 2 is a top perspective view of the power module of FIG. 1 with the step etched metal contact removed.

FIG. 3 is a bottom perspective view of the step etched metal contact showing the terminal contact pads, etched clearance apertures, and etched clearance gaps associated with the power module positioning shown in FIG. 2.

FIG. 4 is a top perspective view of the power module of FIG. 1 after final assembly and comparatively sized to a 2003 Arkansas quarter.

FIG. 5 is a side perspective view of the power module of FIG. 1 after final assembly and comparatively sized to the thickness of the same 2003 Arkansas quarter.

DETAILED DESCRIPTION OF THE INVENTION

Figure 6:
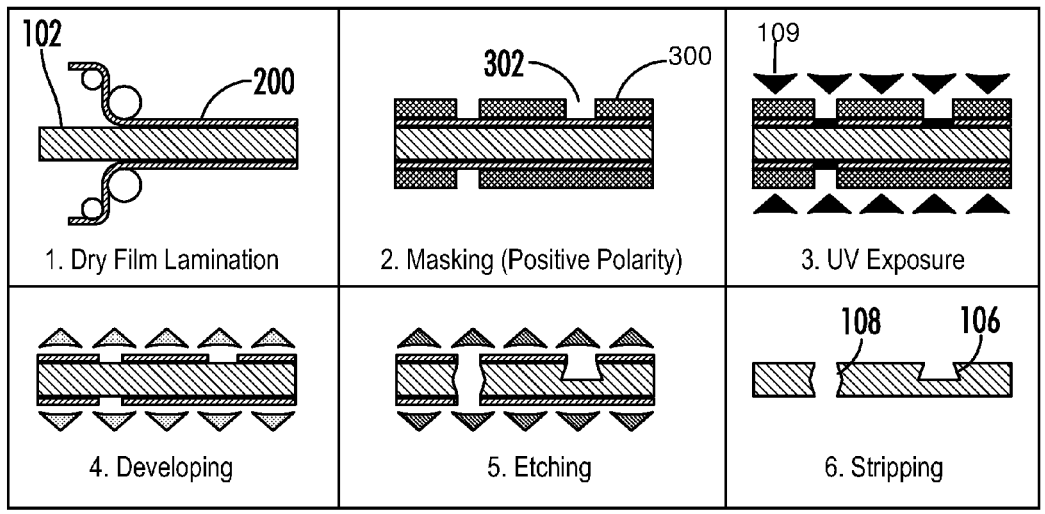
FIG. 6 is a schematic representation of the lamination, masking, exposure, developing, etching and stripping process for forming the step etched metal contact with both a clearance aperture and a clearance gap shown etched in the metal contact layer.

As shown in FIGS. 1 and 3 of the drawings and as best understood by comparison of FIGS. 1 through 10 of the drawings, one exemplary embodiment of the present invention is generally shown as an improved electrical contact using a step etched metal electrical contact 100 to attach to the surface 14 of a terminal 12 of a device 10 or die 10 in a power module 50.

The electrical contact 100 is formed from a main body 102 formed to include a metal tab 104, and define either or both clearance apertures 106, such as trenches 107 and/or clearance gaps 108.

The invention described herein, named PowerStep, introduces a novel solution to these issues by replacing wire bonds entirely with a precision formed, three dimensional metal tab 104 attached directly to the die 10 terminal 12 surface 14, providing enhanced electrical, thermal, and mechanical capabilities. The distinguishing factor of this approach lies in the geometry of the tab 104 itself that can be matched to the terminal 12 size and shape. With PowerStep, the isolation distance is provided by a clearance aperture 106 or clearance trench 107 partially etched in a planar and self-supporting main body 102 such as Al, Cu, or low CTE alloy, providing the necessary gap between the device passivation and electrical path. Raised regions matching the size and location of device terminals 12, such as gate, source, anode, etc., and fully etched trenches 107 and gaps 108 for isolation between connections are rapidly and inexpensively formed with conventional etching equipment and processes. The main body 102 is then attached with a standard soldering operation with reliable high temperature solders such as 80Au/20Sn, often concurrently with the die attach saving processing time and cost. It may also be attached through Thermosonic bonding in the case of aluminum tabs or through a conductive epoxy.

When attached to the terminals 12 of a power device 10, the tab 104 produces a wide, low profile bond which completely utilizes all of the available terminal area for conduction. The cross-sectional area of the tab 104 can be custom tailored and scaled for each device to minimize inductance and maximize current capacity. It also creates a secondary path for heat removal, which can be employed to enhance the thermal performance of the package 50 and particularly for power transients. PowerStep is compelling when compared to other wire bondless approaches such as flip chip, etc. in that each process utilized here is already performed in the manufacturing process ie: etching, plating, soldering and is uniquely suited for high currents and high heat loads.

Step Etching

FIG. 6 shows step-etching as the fundamental process to this module approach, forming a three-dimensional structure in a flat sheet of a metal main body 102 which provides the electrical interconnection and isolation distance from the device 10 surfaces 14 in a single component. Step-etching, in essence, is a photochemical milling process in which selective areas are patterned on one or both sides of a metal foil main body 102. This is performed by first laminating a dry film 200 of photoresist on both sides of a bare metal main body 102. A mask 300 is applied to selectively expose masking aperture 302 regions of the photoresist to ultraviolet light. Depending on the polarity of the photoresist (positive or negative), areas exposed to light will either become soluble or insoluble to a developing solution. The developer dissolves the intended regions, leaving selective patterns of metal exposed and others protected by the film. This is then etched until the desired structure is achieved. Patterned areas on both sides of the sheet are etched through completely, while patterns on only one side are etched halfway. Step-etching is a straightforward process that is traditionally utilized for tool making, part identification or aesthetical purposes such as engraving text, patterns, etc., and is precise to within 10% of the material thickness. This approach is a novel utilization of the step-etch fabrication process, using the patterned foil main body 102 as a core electrical element in the power package.

Developing, etching, and stripping are performed on conveyor chemical milling systems with a heated etchant such as ferric chloride FeCl3 for copper, for example. Substrates such as the main body 102 move along a conveyor as multiple oscillating spray heads continuously expose the surface to fresh warm acid and oxygen, accelerating the process. Many parts are panelized in a pattern that maximizes packing density. Small triangular temporary tabs 109 hold each piece in place similar to stenciling, allowing for the entire panel to be electroplated at once after etching typically with nickel or nickel/gold. The temporary tabs 109 are then clipped as the parts are removed from the panel. Parameters such as spray pressure, oscillation speed, conveyor speed, and etchant temperature may are adjusted as needed to enhance etch rate and edge quality.

Most power devices 10 reserve a relatively small area for the gate pad 12 typically ~20-30 mils on a side. Accordingly, accurately etching a trench 107 around an area this small is crucial to the success of this approach. Generally speaking, there can be ~5-10 mils of over-etching while chemically milling a shape depending on a variety of factors, that must be accounted for in the design. The key is to have a well characterized etching process for each material such that the exposure mask is scaled accordingly.

Materials

A key benefit of an etching procedure is the wide variety of materials which are capable of being chemically etched. Ferric chloride readily etches copper, aluminum, zinc, and many other metals. Copper and aluminum are the key materials for the PowerStep process. They are readily etched to a high precision, have exceptional electrical and thermal properties, and are easily plated with protective and solderable coatings such as nickel/gold. Sheets of each are available with varying levels of hardness according to the amount of annealing performed annealed, half hard, hard temper, etc. Alternatively, low expansion alloys such as Kovar offer a good CTE match with an associated trade-off in conductivity. Metal composite sheets including copper moly and copper tungsten may offer the best compromise of properties, but at a higher cost. The etch rates, chemistry, and maximum resolution of each material varies; however, the core step etch approach is compatible with any metal which may be etched and plated.

Of particular prominence is the Coefficient of Thermal Expansion CTE difference between various materials in the structure and the resulting interface stress that develops. Minimizing the effects of CTE mismatches is crucial as the temperature increases. This issue specifically is a challenge for the tab 104 interface, as it directly contacts low CTE device terminals 12. Three approaches are employed for stress reduction. First, stresses are minimized geometrically—the thickness and etched pattern of the metal foil is analyzed and optimized through FEA software. A supporting structure may be included to provide stiffness. Second, various rigid and flexible potting compounds may be added as a manner of stress relief. Third, low CTE metal foil materials may be utilized for the main body 102. The material selection ultimately depends on the environment, temperature, device metallization, and application conditions for a given structure.

PowerStep Tab Attachment

The attachment method for the PowerStep tab 104 to the device 10 and associated package module 50 depends on the metallization of the device terminals 12. Three methods may be utilized: (1) direct soldering, (2) Thermosonic bonding, and (3) pressure assisted silver sintering.

Soldering is the most desirable choice, as it is well understood, straightforward, and a low cost procedure. Precision machined graphite tooling is employed for alignment and even heat transfer. Optimally, the devices 10 have solderable topsides terminals 14, capped in either gold or silver surfaces 14. Many devices 10 particularly power die 10, however, have aluminum topsides 14 such that they are most compatible with aluminum power wire bonding. Soldering directly to aluminum, while possible, is difficult. This is particularly true on a sensitive surface such as the upper side of a bare die 10 or device 10. Generally, soldering to aluminum requires a very aggressive flux to remove the surface oxide. Flux leaves residues that must be cleaned, may burn or corrode delicate surfaces, and is altogether not a preferred option for attaching the etched strip. Accordingly, flux free aluminum soldering processes must be implemented. One option is to use a fluxing gas such as formic acid in an inert vacuum/pressure oven. Fluxing gasses remove surface oxides in a dry process and do not leave a residue. Another option is to use a reactive solder which contain small amounts of a reactive element such as Ti, Zn, etc. which, aided by ultrasonic vibration, can remove the oxides and create a strong bond to aluminum.

For aluminum topside surfaces 14, an alternative is found in Thermosonic bonding. Here, an aluminum PowerStep tab 104 is bonded to the device in a Thermosonic process (similar to wire and ribbon bonding) with a modified power wire bonder. The bonding tool would be shaped to match the desired bonding footprint and use a combination of heat and ultrasonic energy to weld the aluminum surfaces together. This procedure, however, reduces the bonding area and limits the thickness of the tab 104 to be conducive to the process.

Solder alternatives include silver based sintering adhesives which offer a high thermal conductivity and low processing temperature. These adhesives may be screen printed to the PowerStep tab 104, dried, and then sintered in a heated press or with a spring loaded fixture to the devices. Adhesion promoters may be necessary on the surfaces in order to ensure a high quality interface.

Electrical Benefits

Bond wire inductance can be quickly estimated by equating the length of the wire in mm to the inductance in nH in a 1:1 relationship i.e. 10 mm wire has a 10 nH inductance. Alternatively, the following equations approximate the inductance of bond wire of round and rectangular geometries at lower frequencies, where distances are in cm, and inductance is in nH.

Round Geometries $$(l\text{=length}, \rho\text{=radius}) \quad L \text{ (nH)} = 2l(\ln [2l/\rho] - 0.75)$$

Rectangular Geometries $$(l\text{=length}, w\text{=width}, t\text{=thickness}) \quad L \text{ (nH)} = 2l(\ln [2l/((w+t))] + 0.50049 + [((w+t))/3l])$$

As indicated by these relationships, parasitic inductance is directly proportional to the length of the path and is lessened with increasing cross sections. While wire bond distance can be reduced and a larger wire may be used, there are limitations to what shapes can practically be formed. The loop of the bond adds additional distance and inductance that also must be considered.

Evaluating elaborate structures such as multiple bonds in parallel requires more elegant tools to account for effects such as mutual inductance and skin effect. FASTHENRY is a software tool used to extract electromagnetic parasitic parameters from 3D geometries. This allows for the user to model, simulate, and analyze these values while controlling frequency sweeps and discretization of the geometry.

Figure 7:
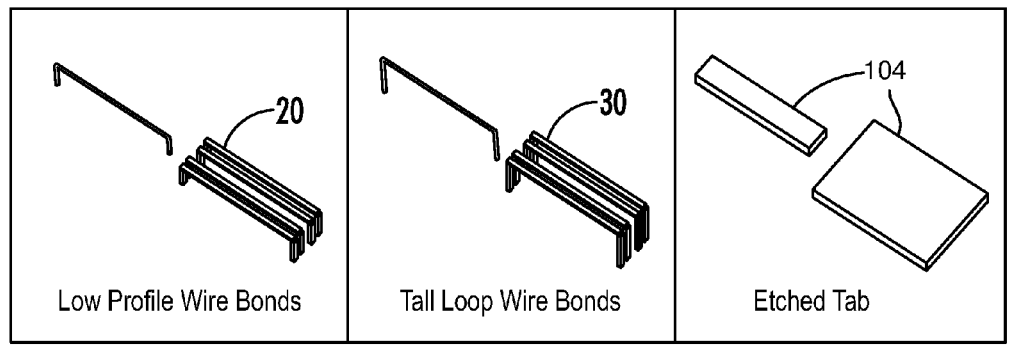
FIG. 7 is a top perspective comparison of the amount of material for low profile wire bonds, tall loop wire bonds, and an etched tab construction of the present invention.
Figure 8:
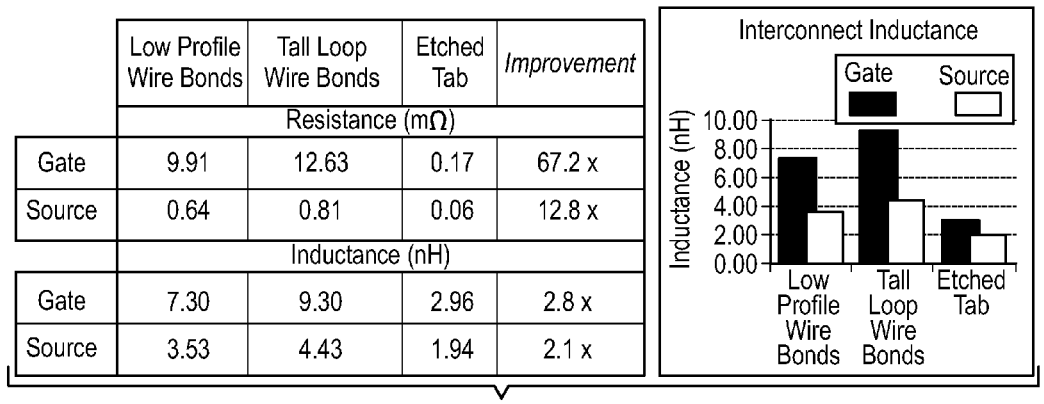
FIG. 8 is a chart and graphic comparison of the resistance and inductance benefits of the present invention against the prior art.

As shown in FIGS. 7 and 8, the benefit of the present invention are substantial. To demonstrate the benefits of the PowerStep contact 100 technique, a series of simulations were performed in FASTHENRY comparing three interconnect configurations on a commercially available SiC MOSFET. Each crosses the same distance 0.25 in, with two wire bond configurations one low profile wire bonds 20 and one with tall loop wire bonds 30 consisting of one 5 mil diameter aluminum gate bond and four 10 mil diameter aluminum source bonds. The tabs 104 are 31.25 mils thick for a common metal sheet thickness and are sized to match the entire area of each device terminal 12. Each profile was sectioned into five logarithmically decreasing elements from the center along the width and height for increased accuracy. The simulations were performed across a range from 10 kHz to 10 MHz.

FIG. 8 provides the results from these simulations with data extracted at 100 kHz. The table on the left outlines the extracted resistance and inductance values for each configuration, while the graph on the right compares the inductance values to clearly display the differences. The PowerStep contact 100 approach represents a distinct improvement over both wire bond configurations. The resistance values show a substantial reduction, particularly for the gate connection where there is room for only one wire bond. While striking, the key benefit is encountered in the inductance, where there is a 2.8× reduction in the gate path, and a 2.1× reduction for the source contact.

Thermal Benefits

Figure 9:
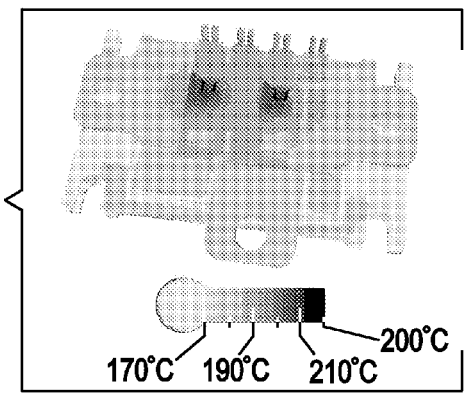
FIG. 9 is a color gradient temperature representation of the advantages of the present invention.

A PowerStep half-bridge module 50 was analyzed in SOLIDWORKS SIMULATION to demonstrate the thermal benefits. A copper moly metal matrix composite MMC base plate, aluminum nitride DBC substrate attached with 95Pb/5Sn solder, SiC devices 10 attached with 80Au/20Sn solder, and copper lead frames were assumed. A heat sink with a performance of 1.5° C./W was emulated in the software at the lower base plate surface. Three configurations were evaluated: (1) with the PowerStep tab 104, (2) without the tab in a wire bonded module, and (3) with the PowerStep tab 104 and an upper heat sink to provide double sided cooling. The performance of the additional heat sink in configuration (3) was chosen to be a conservative 3° C./W to account for the requirement of electrical isolation between the tab and the heat sink. A distributed thermal resistance of 5e-5 K□m2/W was applied to the interface between the base plate and heat sink to simulate the effects of a thermal compound such as silicone grease, etc. An ambient of 25° C. was assumed, while the power applied to each device was swept from 25 to 50 W. An example thermal gradient for the power tab 104 configuration at 50 W per die is shown in FIG. 9.

Figure 10:
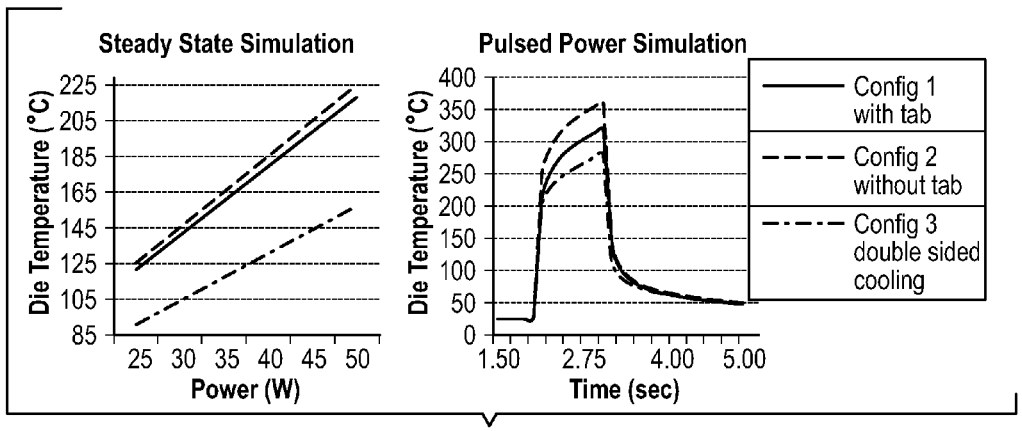
FIG. 10 is a graphic representation of the temperature gradients for 1 the present invention against, 2 the prior art, and 3 the present invention with the further addition of a heat sink thermally bonded to the tab.

As shown in FIG. 10, the peak die temperatures resulting from the power sweeps are presented in the left graph. As shown, there is a small but noticeable difference attributed to the lateral spreading from the PowerStep tab around 5° C. While not an enormous difference in this particular package, it can be enhanced by adjusting thickness and increasing the bond area for larger devices. The real thermal benefits, however, are encountered when the planar upper surface is exploited for double sided cooling. As shown, there is a substantial ~70° C. difference at 50 W per die in this configuration when compared to the wire bonded option.

The added thermal mass of the metal lead frame will also greatly increase resilience to large pulses of power. The right graph above depicts the simulation results for each configuration representing a 500 W pulse applied to each die for 1 kW total for one second. At the beginning of the pulse, the devices themselves are heating up, and the performance of each is nearly identical. Once the heat begins to spread away from the devices, the effects of the PowerStep configurations are clear to see. The peak temperatures the devices encounter during this pulse are reduced by 41° C. and 79° C. for configurations (1) and (3), respectively. This is of great benefit for pulsed power applications, as well as increasing the survivability of continuous systems for one-time events such as a temporary fault.

Reference numerals used throughout the detailed description and the drawings correspond to the following elements:

surface 14
terminal 12
device 10 or die 10
low profile wire bonds 20
tall loop wire bonds 30
package 50
step etched metal electrical contact 100
main body 102 metal tab 104
clearance apertures 106
clearance trench 107
clearance gaps 108
temporary tabs 109
dry film 200
masking material 300
masking apertures 302

From the foregoing, it will be seen that this invention well adapted to obtain all the ends and objects herein set forth, together with other advantages which are inherent to the structure. It will also be understood that certain features and subcombinations are of utility and may be employed without reference to other features and subcombinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' 'having,' or 'including' should be interpreted as open ended claim language that allows additional elements or structures. Finally, where the claims recite "a" or "a first" element of the equivalent thereof, such claims should be understood to include incorporation of one or more such elements, neither requiring nor excluding two or more such elements.

What is claimed is:

1. A step etched metal contact for a die with a first terminal having a size, comprising:
    a main body including a first contact surface, a thickness, and a second surface;
    the first contact surface defining a first contact pad matching the size of the first terminal, the first contact surface configured as a wire-bondless connection to connect the first contact surface to the first terminal; and
    the first contact surface being defined by an etched clearance aperture extending from the first contact surface into the thickness of the main body.

2. The step etched metal contact of claim 1, wherein the main body further comprises a second contact surface including a second contact pad, the second contact surface configured as a wire-bondless connection to connect the second contact surface to a second terminal of the die.

3. The step etched metal contact of claim 2, wherein a size of the second contact pad matches a size of the second terminal.

4. The step etched metal contact of claim 2, wherein the main body further comprises at least one of the following to isolate the first contact surface and the second contact surface: a trench and a gap.

5. The step etched metal contact of claim 1, wherein the main body comprises one of the following: Aluminum, Copper, and a low coefficient of thermal expansion (CTE) alloy.

6. A step etched metal contact for a die with a first terminal having a size, comprising:
    a main body including a first contact surface, a thickness, and a second surface;
    the first contact surface defining a first contact pad matching the size of the first terminal, the first contact surface configured as a wire-bondless connection to connect the first contact surface to the first terminal; and
    a clearance gap extending from the first contact surface to the second surface.

7. The step etched metal contact of claim 6, wherein the main body further comprises a second contact surface including a second contact pad, the second contact surface configured as a wire-bondless connection to connect the second contact surface to a second terminal of the die.

8. The step etched metal contact of claim 7, wherein a size of the second contact pad matches a size of the second terminal.

9. The step etched metal contact of claim 7, wherein the main body further comprises at least one of the following to isolate the first contact surface and the second contact surface: a trench and a gap.

10. The step etched metal contact of claim 6, wherein the main body comprises one of the following: Aluminum, Copper, and a low coefficient of thermal expansion (CTE) alloy.

11. A method of making a step etched metal contact, comprising:
    providing a main body including a first contact surface, a thickness, and a second surface;
    providing the first contact surface defining a first contact pad matching a size of the first terminal, and configuring the first contact surface as a wire-bondless connection to connect the first contact surface to the first terminal; and
    providing the first contact surface with an etched clearance aperture extending from the first contact surface into the thickness of the main body.

12. The method of claim 11, further comprising providing in the main body a second contact surface including a second contact pad, the second contact surface configured as a wire-bondless connection to connect the second contact surface to a second terminal of the die.

13. The method of claim 12, wherein a size of the second contact pad matches a size of the second terminal.

14. The method of claim 12, further comprising providing at least one of the following in the main body to isolate the first contact surface and the second contact surface: a trench and a gap.

15. The method of claim 11, wherein the main body comprises one of the following: Aluminum, Copper, and a low coefficient of thermal expansion (CTE) alloy.

16. The method of claim 11, further comprising laminating a dry film on both sides of the main body.

17. The method of claim 11, further comprising applying a mask to expose aperture regions of the main body.

18. The method of claim 11, further comprising providing a supporting structure to the main body.

19. The method of claim 11, further comprising providing a potting compound to the main body.

20. The method of claim 11, further comprising connecting the first contact surface to the first terminal by one of the following: direct soldering, Thermosonic bonding, and pressure assisted silver sintering.

* * * * *